United States Patent [19]

Hendrix

[11] Patent Number: 5,463,282
[45] Date of Patent: Oct. 31, 1995

[54] ELECTRONIC SUPPLY FOR IGNITING AND OPERATING A HIGH/PRESSURE DISCHARGE LAMP

[75] Inventor: Machiel A. M. Hendrix, Eindhoven, Netherlands

[73] Assignee: U.S. Philips Corporation, New York, N.Y.

[21] Appl. No.: 250,079

[22] Filed: May 27, 1994

[30] Foreign Application Priority Data

Jun. 1, 1993 [EP] European Pat. Off. ........... 93201549.8

[51] Int. Cl.⁶ .................................................. H05B 41/36
[52] U.S. Cl. ..................... 315/209 R; 315/224; 315/307; 315/DIG. 5
[58] Field of Search ................................ 315/244, 209 R, 315/DIG. 5, 200 R, 224, 226, 227 R, 307, 308, 240, 245, 246

[56] References Cited

U.S. PATENT DOCUMENTS 3,265,930  5/1962  Powell ............................... 315/DIG. 5
5,087,859  2/1992  Blankers .............................. 315/209 R

FOREIGN PATENT DOCUMENTS 0507398  10/1992  European Pat. Off. .

*Primary Examiner*—Robert J. Pascal
*Assistant Examiner*—David H. Vu

[57] ABSTRACT

An electronic supply for igniting and operating a high-pressure discharge lamp, comprising a first driven main switching device for generating a high-frequency current through an inductive element and a switching element suitable for subsequently supplying current through the inductive element when the first main switching device is non-conducting. The electronic supply is provided with a transformerless level shifter (LS) and with a driver circuit (S) comprising at least a switch drive device for driving the first driven main switching device. The switching element suitable for the subsequent current supply forms a part of a second driven main switching device which provides periodic commutation of the current through the inductive element, while the level shifter is free from any self-induction elements.

20 Claims, 2 Drawing Sheets

ELECTRONIC SUPPLY FOR IGNITING AND OPERATING A HIGH/PRESSURE DISCHARGE LAMP

BACKGROUND OF THE INVENTION

This invention relates to an electronic supply for igniting and operating a high-pressure discharge lamp, comprising first driven main switching means for generating a high-frequency current through inductive means, and switching means suitable for subsequent current supply through the inductive means when the first main switching means are in the non-conducting state, which electronic supply is provided with a transformerless level shifter and with a driver circuit with at least switch drive means for driving the first driven main switching means.

A circuit arrangement of the kind mentioned in the opening paragraph is known from EP-A-0507398. First main switching means and switch drive means in the known supply are constructed as (MOS)FETs to reduce losses during operation. The level shifter is transformerless, which is an important and favorable feature. Although in itself a transformer constitutes an excellent electrical separation device, the use of a transformer, especially in circuits for the supply and operation of high-pressure discharge lamps, has among its disadvantages a comparatively great bulk and a comparatively high heavy weight, also in the case of a low power transfer, and a high degree of unsuitability for integration. The level shifter is further provided with self-induction means for fast switching of the main switching means while switching losses are reduced at the same time. The known supply, which is suitable for generating a high-frequency current with a frequency of approximately 20 kHz, is of practical use up to frequencies of approximately 50 kHz. At frequencies above 50 kHz, however, the inevitable losses are found to assume unacceptable proportions. These losses are formed to a major extent by the dissipation of energy stored in parasitic capacitances of the switch drive means during periodic switching into conduction of the switch drive means.

The use of high frequencies to above 200 kHz, however, is desirable. On the one hand, the use of such high frequencies makes it possible to use small inductive means. On the other hand, the use of high frequencies is favorable for preventing instabilities in lamp operation caused by acoustic resonances. This is of major importance, particularly where high-pressure sodium lamps and metal halide lamps are concerned.

SUMMARY OF THE INVENTION

An object of the invention is to provide a measure by which an electronic supply is rendered suitable for operation at high frequencies, to above 200 kHz.

A circuit arrangement according to the invention is for this purpose characterized in that the switching means suitable for subsequent current supply form a part of second driven main switching means which serve for periodic commutation of current through the inductive means. Owing to the periodic commutation of the current through the inductive means, the circuit arrangement according to the invention has the advantage that switching of the first main switching means into the conducting state can take place at a moment at which the voltage across the first main switching means is substantially zero. This renders possible a fast switching with very low losses. It is furthermore possible to realize the level shifter without separate self-induction means. Since it was found in practice that a suitable choice of the dimensions of the level shifter self-induction means is a critical item as regards a good operation of the circuit arrangement, the possibility of dispensing with these self-induction means is an advantage.

Given a comparatively small supply voltage of the order of 20–30 V, the use of a p-channel MOSFET as the first main switching means and an n-channel MOSFET as the second switching means makes it possible to realize an electronic supply without a level shifter and in which the p-channel MOSFET is switched into conduction periodically when the voltage across the p-channel MOSFET is substantially zero. Such a supply proposed in the literature is unsuitable for use as a supply for igniting and operating a high-pressure discharge lamp. High-pressure discharge lamps have power levels which vary from approximately 30 W to 1000 W or more. The use of low voltages for such power levels leads to high current levels which in their turn strongly reduce the possibility of miniaturising the apparatus, especially the inductive means. High current levels are also disadvantageous because of the losses which occur, in particular the switching losses. A major, even essential disadvantage of the proposed circuit arrangement is the necessary use of a p-channel MOSFET. Owing to the substantially smaller mobility of holes in semiconductors compared with that of electrons, a p-channel version leads to higher internal losses which can only be counteracted by increasing the semiconductor surface area. This necessarily leads to a considerable cost increase for such a p-channel MOSFET.

In an advantageous embodiment of the electronic supply, the level shifter is provided with a switch which constitutes a current source during switching into the conducting state. This renders it possible in an advantageous manner to limit the discharge current of the main switching means to be switched off. This discharge current is mainly a result of the internal parasitic capacitances of the relevant main switching means. The discharge current causes switching-off losses owing to dissipation to internal resistances of the main switching means. A reduction of the discharge current thus leads to a reduction in the switching-off losses.

Preferably, delaying means are present in the electronic supply for driving the switch fully into conduction with a delay. The driving into full conduction causes the main switching means to be non-conducting after the limited discharge current of the main switching means to be switched off has been flowing during the delay time generated by the delaying means.

A further improvement is obtainable in that the switch, when in the fully conducting state, is connected to a voltage which is negative relative to that of the electronic supply. Any residual voltage at the control electrode of the relevant main switching means owing to voltage drops across diode means thus remains below the threshold voltage required for conduction of the relevant main switching means.

The invention is applicable to each of the three generally known types of electronic supplies, i.e. up-converter, down-converter and flyback converter.

BRIEF DESCRIPTION OF THE DRAWING

The above and other aspects of an embodiment of an electronic supply according to the invention will now be explained in more detail with reference to the accompanying drawing, in which FIGS. 1a, b, c is an equivalent diagram of an electronic supply according to the invention for three main supply types.

DESCRIPTION OF THE PREFERRED EMBODIMENTS

Figure 1A:
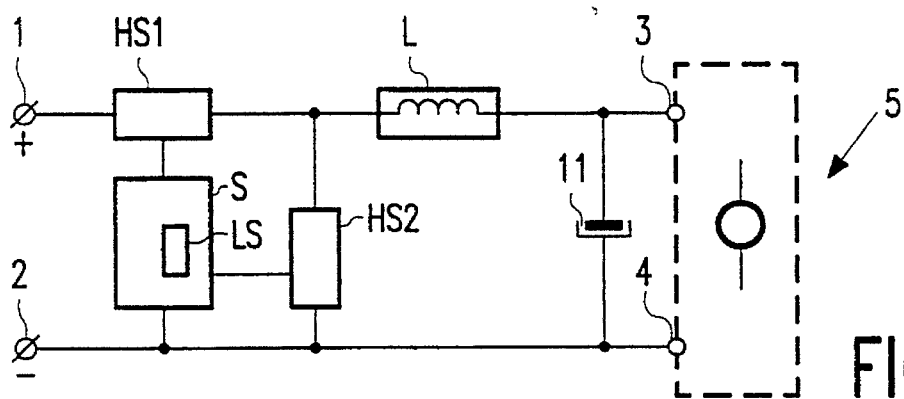
Figure 1B:
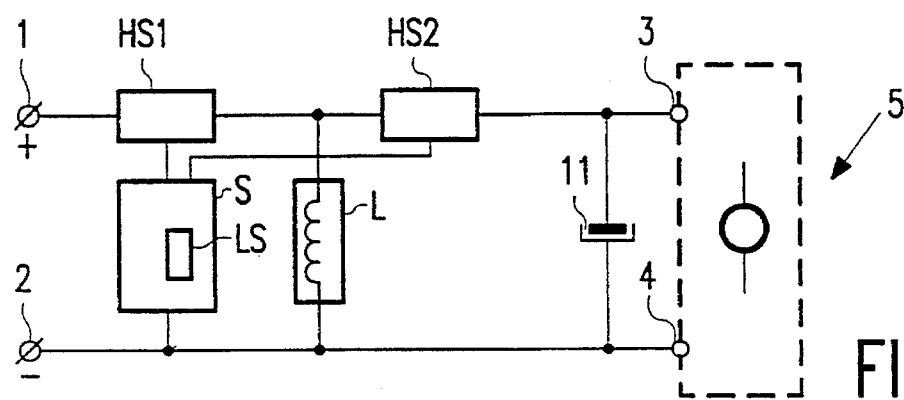
Figure 1C:
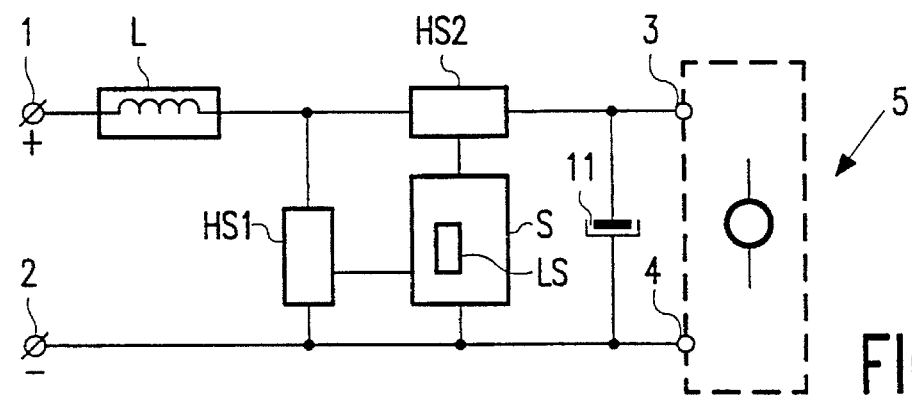

In FIG. 1a, b, c, corresponding parts are referenced correspondingly. Reference numbers 1 and 2 denote input terminals for connecting a DC voltage source, and 3, 4 are connection terminals for connecting a high-pressure discharge lamp 5 to be ignited and operated. The lamp may be included in a commutation circuit in this case. The connection terminals 3, 4 are also interconnected by capacitive means 11. The electronic supply comprises first driven main switching means HS 1 for generating a high-frequency current through inductive means L. HS 2 denotes second driven main switching means. The second driven main switching means HS 2 also comprise switching means which are suitable for subsequent current supply through the inductive means L when the first main switching means HS 1 are non-conducting. The electronic supply is provided with a transformerless level shifter LS and with a driver circuit S which comprises at least switch drive means for driving the main switching means HS 1 and HS 2. The level shifter, moreover, is free from self-induction means.

Figure 2:
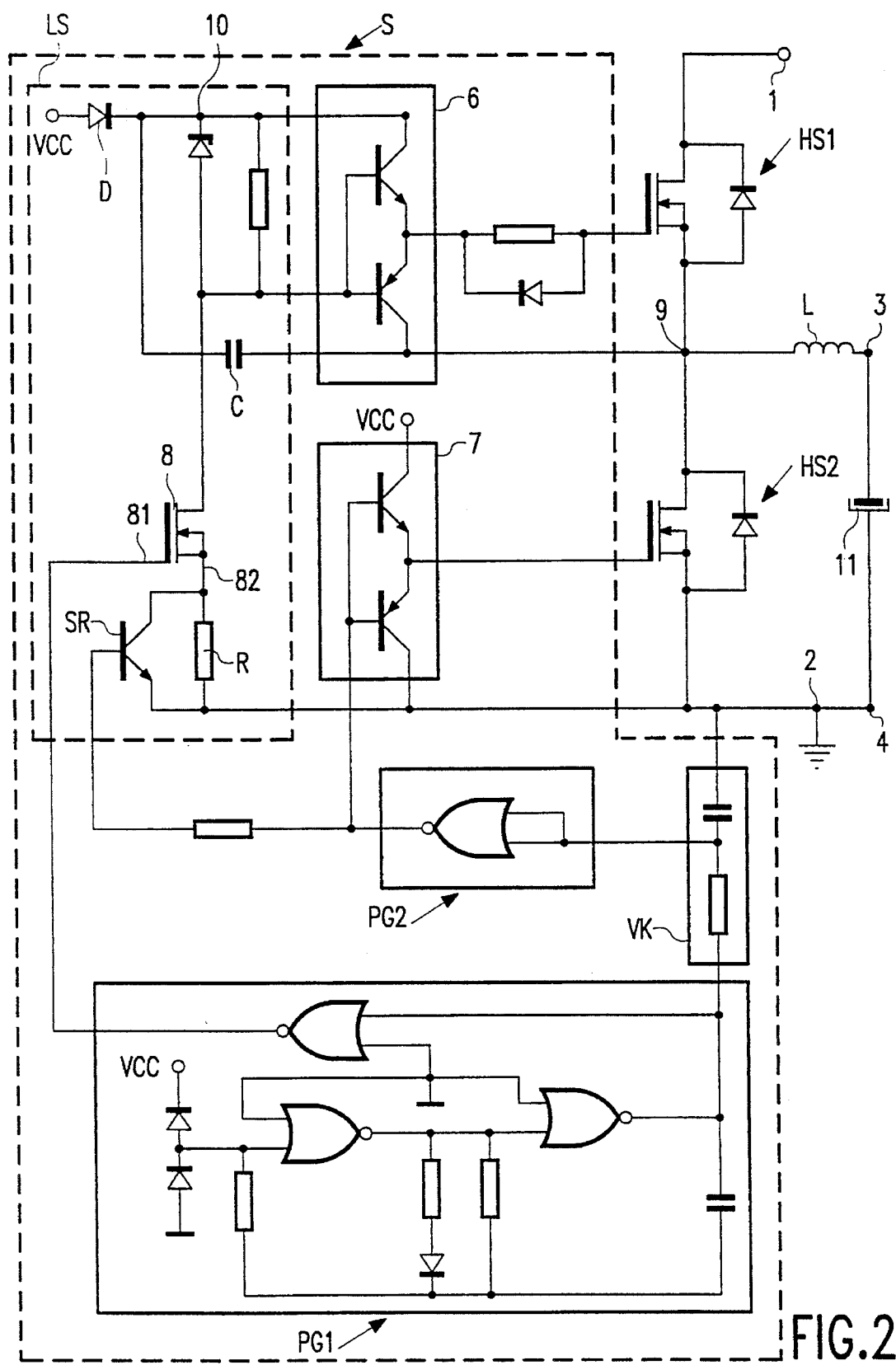
FIG. 2 shows the electronic supply of FIG. 1a in more detail.

The electronic supply of FIG. 1a is shown in more detail in FIG. 2. The first and second main switching means HS 1 and HS 2 are constructed as MOSFETs and are accordingly each provided with an internal diode. The internal diode of MOSFET HS 2 serves as a switching means for the subsequent current supply through the inductive means L when the MOSFET HS 1 is in the non-conducting state.

S denotes a driver circuit which is provided with switch drive means 6, 7 for driving the first driven main switching means HS 1 and the second driven main switching means HS 2, respectively. A transformerless level shifter LS forms a part of the driver circuit S and is free from self-induction means. The level shifter is provided with a switch 8, constructed as a FET, which is controlled by a pulse generator PG 1 at a gate 81. The switch 8 has a source branch 82 which includes a resistor R.

Resistor R is shunted by a switch SR. Switch SR is driven by a pulse generator PG 2 which in its turn is connected to an output of pulse generator PG 1 via a delay network VK.

The level shifter is supplied from an auxiliary voltage Vcc which is connected through a diode D on the one hand to switch 8 and on the other hand to a capacitor C. The capacitor C is connected at junction 9 to both of the main switching means HS 1 and HS 2 and to the inductive means L. With the switch 8 in the conducting state, and accordingly HS 1 in the non-conducting state, the capacitor C is charged by means of the auxiliary voltage Vcc.

When the switch 8 is rendered non-conducting owing to a signal from pulse generator PG 1, the first main switching means HS 1 will be rendered conducting by means of the auxiliary voltage Vcc and the switch drive means 6.

The moment the main switching means HS 1 becomes conducting, the voltage at point 10 follows the voltage at point 9 and thus that at the input terminal 1, rising to above the voltage Vcc. The main switching means HS 1 are then further supplied, and thus kept in the conducting state, from the voltage stored on capacitor C.

Then the switch 8 is rendered conducting again via the pulse generator PG 1. Together with the resistor R in the source branch 82, the switch 8 initially forms a current source. As a result, charge can be drained from the first main switching means HS 1 comparatively slowly, which is favorable for restricting switching losses.

After a delay provided by through the delay network VK, the pulse generator PG 2 supplies a pulse which is delayed relative to that of pulse generator PG 1, which renders switch SR conducting whereby resistor R is shunted. The switch 8 is driven fully into conduction by this, so that the first main switching means HS 1 are forced into the non-conducting state and kept that way.

The second main switching means HS 2 are rendered conducting by means of the same pulse generated by pulse generator PG 1 via control switch 7. Short-circuiting of the input terminals 1, 2 by the main switching means HS 1 and HS 2 is out of the question in this way. The risk of short-circuiting may be even further counteracted through the connection of resistor R and switch SR to a voltage which is negative compared with the electronic supply, more in particular to input terminal 2.

In the embodiment described, the two main switching means HS 1 and HS 2 are constructed as MOSFETs, i.e. with internal freewheel diodes. It is also possible to include separate, external freewheel diodes in the circuit arrangement.

The operation of the electronic supply is as follows. In the conducting state, current flows through the first main switching means HS 1 to the inductive means L. Then the first main switching means HS 1 are rendered nonconducting, after which subsequent current supply takes place through the internal diode of the second main switching means HS 2. The current to the inductive means decreases during this period, and commutation thereof takes place after a certain time. The capacitive means 11 serve as a current supply during this period. Since the second main switching means HS 2 have been rendered conducting by the delay pulse originating from pulse generator PG 2 in the meantime, the commutated current can flow for some time. Subsequently, after a short time, the second main switching means HS 2 are rendered non-conducting. The current flowing through the inductive means L will subsequently charge the parasitic capacitance of the main switching means HS 1 until the voltage at point 9 has become equal to the voltage at point 1, after which the diode of the main switching means HS 1 will enter the conducting state. The comparatively small commutated current of the inductive means L now flows through the internal diode of the first main switching means HS 1 to input terminal 1 and will decrease further. In the period between the moment that the internal diode of the first main switching means HS 1 becomes conducting and the moment the commutated current of the inductive means L becomes substantially zero, the first main switching means HS 1 are driven into the conducting state, after which the current will flow to the inductive means again.

In a practical realization of the described embodiment of the electronic supply, the DC voltage at the input terminals 1, 2 was 380 V. The load at the connection terminals 3, 4 was formed by a 32 W metal halide lamp with a lamp voltage of 98 V. The generated high-frequency current had a frequency of 180 kHz. The power dissipated in the electronic supply was 1.3 W. The inductive means L had a value of 0.18 mH. The inductive means L was constructed as a pot core coil of the RM5 type with coil dimensions of 1 cm×1 cm×1 cm.

I claim:

1. An electronic supply for igniting and operating a high-pressure discharge lamp, comprising: first driven main switching means for generating a high-frequency current through inductive means, a second driven main switching means, switching means for the subsequent supply of current through the inductive means when the first driven main switching means are in the non-conducting state, a transformerless level shifter coupled to at least one of said first and second driven main switching means, a driver circuit with at least switch drive means for driving the first driven main switching means, wherein said switching means for the subsequent current supply comprise a part of the second driven main switching means which provide periodic commutation of current through the inductive means, and wherein the level shifter is free of self-induction means.

2. An electronic supply as claimed in claim 1, wherein the level shifter comprises a switch which constitutes a current source during switching into the conducting state.

3. An electronic supply as claimed in claim 2, further comprising delaying means for driving the switch fully into conduction with a time delay.

4. An electronic supply as claimed in claim 3, further comprising a supply voltage terminal for said electronic supply, wherein the switch, when in the fully conducting state, is connected to a voltage which is negative relative to that of the supply voltage terminal.

5. An electronic supply as claimed in claim 2, further comprising a supply voltage terminal for said electronic supply, wherein the switch, when in the fully conducting state, is connected to a voltage which is negative relative to that of the supply voltage terminal.

6. A switched mode power supply comprising:

an input terminal for connection to a source of supply voltage, a first main switching means, an inductor, an output terminal for connection to a load, a second main switching means, means coupling said inductor to said first and second main switching means and to said output terminal such that said first main switching means causes a high frequency current to flow through the inductor and the second main switching means commutates current flow through the inductor, a driver circuit including a voltage level shifter and switched drive means coupled to said voltage level shifter and to a control electrode of the first main switching means for driving said first main switching means into conduction and non-conduction at said high frequency, wherein the second main switching means includes further switching means for the supply of current to the inductor during non-conduction time periods of the first main switching means, and the voltage level shifter is devoid of inductor elements.

7. The switched mode power supply as claimed in claim 6, wherein the voltage level shifter further comprises a controlled switch coupled to the first main switching means so as to operate as a current source during conduction periods of said first main switching means.

8. The switched mode power supply as claimed in claim 7 further comprising time delay means coupled to said controlled switch so as to drive said controlled switch into full conduction after a time delay determined by said time delay means.

9. The switched mode power supply as claimed in claim 7 further comprising a second input terminal coupled to one of said first and second main switching means and adapted for connection to a second terminal of said source of supply voltage, and means for coupling said controlled switch to a point of negative voltage relative to that of the second input terminal.

10. The switched mode power supply as claimed in claim 6 comprising a further input terminal for connection to an auxiliary supply voltage, and second means coupling said further input terminal to said first main switching means and to said voltage level shifter.

11. The switched mode power supply as claimed in claim 6 further comprising:

a second input terminal coupled to the switched mode power supply and adapted for connection to a second terminal of said source of supply voltage, and wherein said coupling means couples said inductor in a first series circuit with said first main switching means between said output terminal and the first input terminal and in a second series circuit with said second main switching means between said output terminal and the second input terminal.

12. The switched mode power supply as claimed in claim 6 further comprising:

a second input terminal for connection to a second terminal of said source of supply voltage, a further input terminal for connection to an auxiliary supply voltage, wherein the voltage level shifter further comprises a controlled switch coupled to the second input terminal and to the further input terminal, and second means coupling a control electrode of the first main switching means via said switch drive means to a junction point between the further input terminal and the controlled switched.

13. The switched mode power supply as claimed in claim 12 wherein, said first coupling means couples said inductor in a series circuit with said first main switching means between said output terminal and the first input terminal, and said voltage level shifter includes a capacitor coupled between said further input terminal and a junction point between said inductor and said first main switching means.

14. The switched mode power supply as claimed in claim 7 further comprising:

a second controlled switch and a resistor connected in a parallel circuit which is connected in series with the first controlled switch, and a pulse generator supplying switching pulses to a control electrode of the first controlled switch and via a time delay means to a control electrode of the second controlled switch.

15. The switched mode power supply as claimed in claim 6 wherein said first main switching means comprises a MOSFET having a gate electrode and a source electrode, and said driver circuit includes a capacitor coupled to said source electrode and via said switch drive means to said gate electrode whereby the capacitor is periodically connected between said gate electrode and said source electrode of said MOSFET so as to provide a switching voltage to produce conduction of said MOSFET.

16. The switched mode power supply as claimed in claim 15 comprising:

further means coupling said capacitor to said further input terminal such that the capacitor is charged from said further input terminal during the non-conduction of said MOSFET, and wherein the voltage level shifter further comprises a controlled switch coupled to the first main switching means.

17. The switched mode power supply as claimed in claim 6 wherein said first and second main switching means comprise first and second MOSFETS, respectively, and said further switching means of the second main switching means comprises a diode in parallel with the second MOSFET.

18. The switched mode power supply as claimed in claim 6 wherein the inductor and said first and second main switching means are coupled together in circuit so as to form an up-converter.

19. The switched mode power supply as claimed in claim 6 wherein the inductor and said first and second main switching means are coupled together in circuit so as to form a down-converter.

20. The switched mode power supply as claimed in claim 6 wherein the inductor and said first and second main switching means are coupled together in circuit so as to form a flyback converter.

* * * * *